(12) United States Patent
Aoki

(10) Patent No.: US 11,393,953 B2
(45) Date of Patent: Jul. 19, 2022

(54) LIGHT EMITTING ELEMENT AND METHOD OF MANUFACTURING SAME

(71) Applicant: NICHIA CORPORATION, Anan (JP)

(72) Inventor: Yusuke Aoki, Anan (JP)

(73) Assignee: NICHIA CORPORATION, Anan (JP)

( * ) Notice: Subject to any disclaimer, the term of this patent is extended or adjusted under 35 U.S.C. 154(b) by 124 days.

(21) Appl. No.: 16/893,633

(22) Filed: Jun. 5, 2020

(65) Prior Publication Data

US 2020/0388724 A1    Dec. 10, 2020

(30) Foreign Application Priority Data

Jun. 7, 2019   (JP) .............................. JP2019-106647

(51) Int. Cl.
*H01L 33/32*      (2010.01)
*H01L 33/38*      (2010.01)
(Continued)

(52) U.S. Cl.
CPC ............ *H01L 33/32* (2013.01); *H01L 33/007* (2013.01); *H01L 33/0093* (2020.05);
(Continued)

(58) Field of Classification Search
CPC ......... H01L 33/38; H01L 33/32; H01L 33/58; H01L 33/007; H01L 33/0093;
(Continued)

(56) References Cited

U.S. PATENT DOCUMENTS 6,498,048 B2 * 12/2002 Morita ................ H01L 21/0237
                                                         438/22
6,627,520 B2 *  9/2003 Kozaki ............... H01L 21/0242
                                                        438/479
(Continued)

FOREIGN PATENT DOCUMENTS

JP      2000-164989 A     6/2000
JP      2006-347863 A    12/2006
(Continued)

*Primary Examiner* — Savitri Mulpuri
(74) *Attorney, Agent, or Firm* — Birch, Stewart, Kolasch & Birch, LLP

(57) ABSTRACT

A light emitting element comprises: a semiconductor layered body including a first semiconductor layer of a first conductivity type, a second semiconductor layer of a second conductivity type, and a light emitting layer provided between the first semiconductor layer and the second semiconductor layer; and a dielectric member being in contact with the first semiconductor layer. The first semiconductor layer refractive index with respect to a wavelength of light differs from the light emitting layer refractive index with respect to the wavelength of light. The dielectric member comprises a first dielectric portion and a second dielectric portion. In a second direction that is perpendicular to a first direction that extends from the second semiconductor layer to the first semiconductor layer, a first portion of the first semiconductor layer is positioned between the first dielectric portion and the second dielectric portion. The first dielectric portion comprises the first surface and the second surface. In the first direction, the first surface is positioned between the (Continued)

second surface and the first semiconductor layer. The first surface is inclined relative to the first direction.

13 Claims, 5 Drawing Sheets

(51) Int. Cl.
  *H01L 33/00* (2010.01)
  *H01L 33/58* (2010.01)
  *H01L 33/62* (2010.01)
  *H01L 33/20* (2010.01)
(52) U.S. Cl.
  CPC .............. *H01L 33/20* (2013.01); *H01L 33/38* (2013.01); *H01L 33/58* (2013.01); *H01L 33/62* (2013.01); *H01L 2933/0025* (2013.01); *H01L 2933/0058* (2013.01)
(58) Field of Classification Search
  CPC . H01L 33/20; H01L 33/62; H01L 2933/0025; H01L 2933/0058
  See application file for complete search history.

(56) References Cited

U.S. PATENT DOCUMENTS

| | | | | |
|---|---|---|---|---|
| 7,619,261 | B2 * | 11/2009 | Koide | H01L 21/0265 |
| | | | | 257/103 |
| 7,691,732 | B2 * | 4/2010 | Okahisa | H01L 29/045 |
| | | | | 438/46 |
| 9,418,887 | B2 * | 8/2016 | Nakajima | H01L 21/0337 |
| 2009/0085165 | A1 * | 4/2009 | Hiramatsu | H01L 33/007 |
| | | | | 438/483 |
| 2011/0297987 | A1 | 12/2011 | Koizumi et al. | |
| 2016/0359082 | A1 * | 12/2016 | Hao | H01L 33/0066 |

FOREIGN PATENT DOCUMENTS

| | | |
|---|---|---|
| JP | 2011-258675 A | 12/2011 |
| JP | 2017-504221 A | 2/2017 |

\* cited by examiner

LIGHT EMITTING ELEMENT AND METHOD OF MANUFACTURING SAME

CROSS-REFERENCE TO RELATED PATENT APPLICATION

The present application claims priority under 35 U. S. C. § 119 to Japanese Patent Application No. 2019-106647, filed Jun. 7, 2019, the contents of which are incorporated herein by reference in their entirety.

BACKGROUND

The present disclosure relates to a light emitting element and a method of manufacturing the same.

Japanese Patent Publication No. 2011-258675 discloses a light emitting element in which a light transmissive layer for light distribution control is disposed on the light extraction surface side of the light emitting element. In relation to such a light emitting element, it is desired to further simply control the light distribution characteristic.

SUMMARY

An embodiment of the present disclosure provides a light emitting element which enables simplified control over the light distribution characteristic, and a method of manufacturing the same.

In one embodiment of the present disclosure, a light emitting element includes: a semiconductor layered body including a first semiconductor layer of a first conductivity type, a second semiconductor layer of a second conductivity type, and a light emitting layer provided between the first semiconductor layer and the second semiconductor layer; and a dielectric member disposed in contact with the first semiconductor layer. The first semiconductor layer refractive index with respect to a wavelength of light differs from the light emitting layer refractive index with respect to the wavelength of light. The dielectric member comprises a first dielectric portion and a second dielectric portion. In a second direction that is perpendicular to a first direction that extends from the second semiconductor layer to the first semiconductor layer, a first portion of the first semiconductor layer is positioned between the first dielectric portion and the second dielectric portion. The first dielectric portion includes a first surface and a second surface. In the first direction, the first surface is positioned between the second surface and the first semiconductor layer. The first surface is inclined relative to the first direction.

In one embodiment of the present disclosure, a method of manufacturing a light emitting element includes: providing a structure including a substrate, a dielectric layer, and a semiconductor member provided between the substrate and the dielectric layer; removing a portion of the dielectric layer to expose a surface of the semiconductor member and form a dielectric member from the dielectric layer; growing, on the exposed surface, a semiconductor layered body covering the dielectric member and including a light emitting layer; and removing the substrate. the dielectric member is formed to include a first surface and a second surface; the first surface is in contact with the semiconductor layered body, and inclined relative to a first direction from the semiconductor member to the semiconductor layered body; and the second surface is positioned between the first surface and the semiconductor member.

One embodiment of the present disclosure provides a light emitting element which enables simplified control over the light distribution characteristic, and a method of manufacturing the same.

DETAILED DESCRIPTION OF EMBODIMENTS

Figure 1:
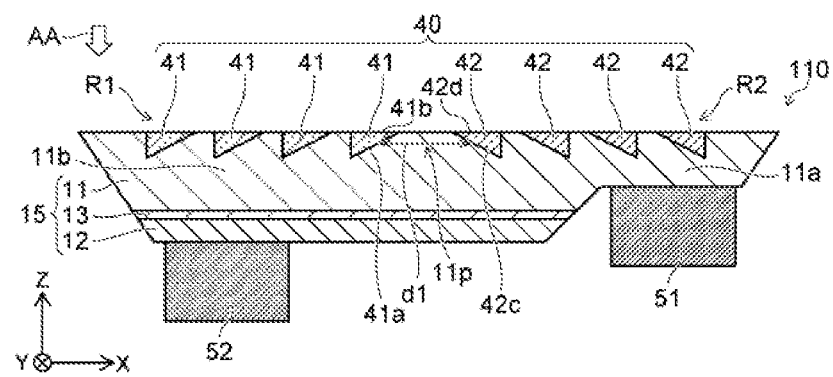
FIG. 1 is a schematic cross-sectional view exemplarily showing a light emitting element according to a first embodiment.

In the following, with reference to the drawings, a description will be given of embodiments of the present disclosure.

The drawings are of schematic or conceptual nature, and the relationship between the thickness and width of any portion, the size ratio between any portions and the like may not coincide with the actual values. Even when identical portions are illustrated, they may appear different in relative length or ratio among the drawings. In the present specification, an element identical to that previously described with reference to any drawings is denoted by an identical reference character, and the detailed description thereof will be omitted as appropriate.

First Embodiment

Figure 2:
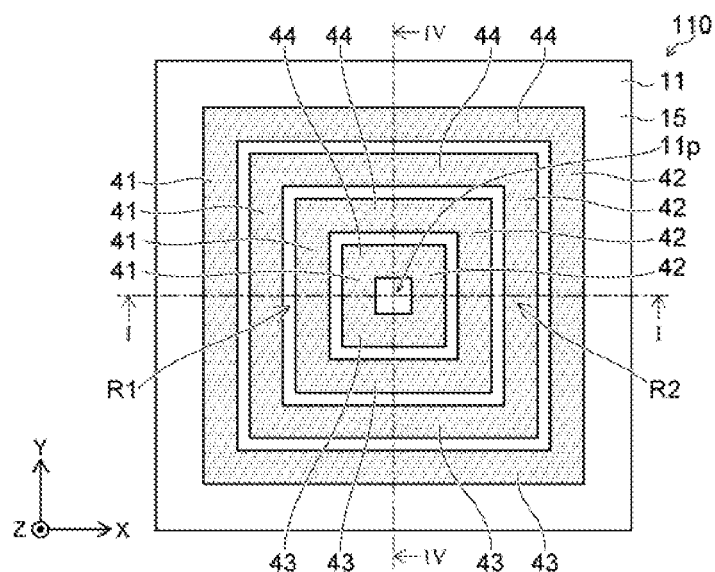
FIG. 2 is a schematic plan view exemplarily showing the light emitting element according to the first embodiment.

FIG. 1 is a schematic cross-sectional view exemplarily showing a light emitting element according to a first embodiment, and is a cross-sectional view taken along line I-I in FIG. 2. FIG. 2 is a schematic plan view exemplarily showing the light emitting element according to the first embodiment, and is a plan view of the light emitting element on arrow AA in FIG. 1.

As shown in FIG. 1, the light emitting element 110 according to the present embodiment includes a semiconductor layered body 15 and a dielectric member 40. The semiconductor layered body 15 includes a first semiconductor layer 11, a second semiconductor layer 12, and a light emitting layer 13. The light emitting layer 13 is provided between the first semiconductor layer 11 and the second semiconductor layer 12. The first semiconductor layer 11, the second semiconductor layer 12, and the light emitting layer 13 are each, for example, a nitride semiconductor. The nitride semiconductor is a gallium nitride-based semiconductor material such as, for example, $In_xAl_yGa_{1-x-y}N$ ($0 \le x$, $0 \le y$, $x+y \le 1$).

The first semiconductor layer 11 is the first conductivity type. The second semiconductor layer 12 is the second conductivity type. For example, the first conductivity type is n-type, and the second conductivity type is p-type. The first conductivity type may be p-type, and the second conductivity type may be n-type. In the following example, the first conductivity type is n-type, and the second conductivity type is p-type. For example, the first semiconductor layer 11 contains n-type GaN. For example, the second semiconductor layer 12 contains p-type GaN or p-type AlGaN.

The direction from the second semiconductor layer 12 to the first semiconductor layer 11 is defined as the first direction. The first direction is, for example, the Z-axis direction. One direction perpendicular to the Z-axis direction is defined as the X-axis direction. The direction perpendicular to the Z-axis direction and the X-axis direction is defined as the Y-axis direction.

The semiconductor layered body 15 is substantially parallel to, for example, the X-Y plane. For example, the first semiconductor layer 11 and the second semiconductor layer 12 are substantially parallel to the X-Y plane.

For example, the first semiconductor layer 11 includes a first semiconductor region 11a and a second semiconductor region 11b. The light emitting layer 13 is provided between the second semiconductor region 11b and the second semiconductor layer 12 in the Z-axis direction. On the second semiconductor region 11b, the light emitting layer 13 and the second semiconductor layer 12 are provided. The direction from the second semiconductor region 11b to the first semiconductor region 11a substantially extends along the X-Y plane.

In this example, a first electrode 51 and a second electrode 52 are disposed at the light emitting element 110. The first electrode 51 is electrically connected to the first semiconductor layer 11. The second electrode 52 is electrically connected to the second semiconductor layer 12. For example, the first electrode 51 is disposed on the first semiconductor region 11a, and connected to the first semiconductor layer 11. When voltage is applied across the first electrode 51 and the second electrode 52, current flows in the semiconductor layered body 15, and light is emitted from the light emitting layer 13.

The dielectric member 40 is disposed in contact with the first semiconductor layer 11. The refractive index of the first semiconductor layer 11 to the wavelength of light from the light emitting layer 13 is different from the refractive index of the dielectric member 40 to the wavelength of that light. For example, the first semiconductor layer 11 contains GaN, and the dielectric member 40 contains $SiO_2$. The peak wavelength of light emitted from the light emitting layer 13 is in a range of, for example, 430 nm to 540 nm. In one example, the peak wavelength of light emitted from the light emitting layer 13 is, for example, about 450 nm. The refractive index of GaN at the wavelength of about 450 nm is about 2.7. The refractive index of $SiO_2$ at the wavelength of about 450 nm is about 1.5. The dielectric member 40 and the first semiconductor layer 11 being in contact with each other are different from each other in refractive index. Therefore, the propagation direction of light transmitting through the interface between the dielectric member 40 and the first semiconductor layer 11 changes.

As shown in FIG. 1, the dielectric member 40 includes, for example, a first dielectric portion 41 and a second dielectric portion 42. One direction perpendicular to the first direction is defined as the second direction. The second direction is, for example, the X-axis direction. As shown in FIG. 1, in the second direction, a portion 11p of the first semiconductor layer 11 is disposed between the first dielectric portion 41 and the second dielectric portion 42.

As shown in FIG. 1, a plurality of first dielectric portions 41 and a plurality of second dielectric portions 42 can be disposed. The interval of the plurality of first dielectric portions 41 can be regular. The interval of the plurality of first dielectric portions 41 can be in a range of, for example, 1 μm to 3 μm. Here, the interval of the plurality of first dielectric portions 41 is the shortest distance between adjacent ones of the first dielectric portions 41. The interval of the plurality of second dielectric portions 42 can be similar to that of the first dielectric portions 41.

As shown in FIG. 2, in the present embodiment, the dielectric member 40 includes a plurality of portions. One region included in the plurality of portions corresponds to one of the plurality of first dielectric portions 41. Other one region included in the plurality of portions corresponds to one of the plurality of second dielectric portions 42. As shown in FIG. 2, in the first embodiment, the dielectric member 40 is divided into a first region R1 in which the first dielectric portion 41 is disposed and a second region R2 in which the second dielectric portion 42 is disposed, by the boundary which is the line equally dividing the area of the first semiconductor layer 11 in a top view. In the embodiment, the shape (pattern) of the plurality of portions included in the dielectric member 40 may be arbitrarily determined. For example, the dielectric member 40 may have one "spiral" pattern. In this case, one region in the "spiral" pattern is the first dielectric portion 41, and other one region in the "spiral" pattern is the second dielectric portion 42.

As shown in FIG. 1, the first dielectric portion 41 includes a first surface 41a and a second surface 41b. In the first direction (the Z-axis direction), the first surface 41a is positioned between the second surface 41b and the first semiconductor layer 11. The first surface 41a is the surface on the first semiconductor layer 11 side. The first surface 41a is in contact with the first semiconductor layer 11. The second surface 41b is not covered with, for example, the first semiconductor layer 11. The second surface 41b is exposed from the first semiconductor layer 11.

In the present embodiment, the first surface 41a is inclined relative to the first direction (the Z-axis direction). The first surface 41a is inclined relative to the axis extending in the first direction (the Z-axis direction). As described below, the propagation direction of light propagating in the first direction (the Z-axis direction) and transmitting through the first surface 41a changes at the first surface 41a.

As shown in FIG. 1, the second dielectric portion 42 includes a third surface 42c and a fourth surface 42d. In the first direction (the Z-axis direction), the third surface 42c is positioned between the fourth surface 42d and the first semiconductor layer 11. The third surface 42c is the surface on the first semiconductor layer 11 side. The third surface 42c is in contact with the first semiconductor layer 11. The fourth surface 42d is not covered with, for example, the first semiconductor layer 11. The fourth surface 42d is exposed from the first semiconductor layer 11.

The cross-sectional shape of each of the first dielectric portion 41 and the second dielectric portion 42 is, for example, triangular or quadrangular. When the cross-sectional shape of the first dielectric portion 41 is quadrangular, the first dielectric portion 41 includes the first surface 41a, the second surface 41b, and other surfaces connecting between the first surface 41a and the second surface 41b. The other surfaces are perpendicular to the second surface 41b. This minimizes any change in the propagation direction of light propagating in the first direction (the Z-axis direction) by the other surfaces. When the cross-sectional shape of the second dielectric portion 42 is triangular, the second dielectric portion 42 includes the third surface 42c, the fourth surface 42d, and other surfaces connecting between the third surface 42c and the fourth surface 42d. The other surfaces are perpendicular to the fourth surface 42d. This minimizes any change in the propagation direction of light propagating in the first direction (the Z-axis direction) by the other surface.

In the present embodiment, the third surface 42c is inclined relative to the first direction (the Z-axis direction). As described below, the propagation of light transmitting through the third surface 42c changes at the third surface 42c.

Figure 3:
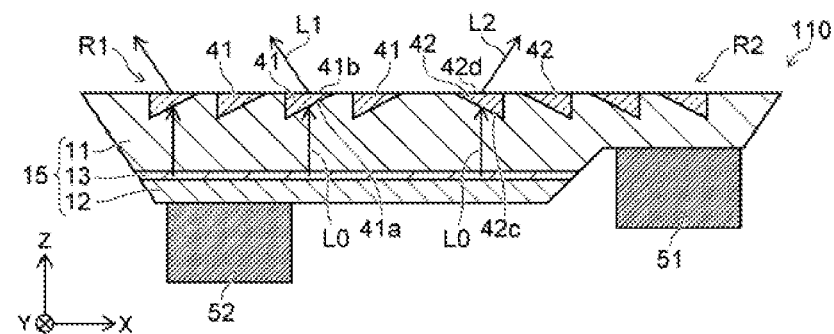
FIG. 3 is schematic cross-sectional view exemplarily showing the light emitting element according to the first embodiment.

FIG. 3 is a schematic cross-sectional view exemplarily showing the light emitting element according to the first embodiment.

As shown in FIG. 3, light L0 is emitted from the light emitting layer 13. The light L0 becomes incident on the first surface 41a of the first dielectric portion 41. By the difference in refractive index between the first semiconductor layer 11 and the first dielectric portion 41, the propagation direction of light L0 changes at the first surface 41a. Furthermore, by the difference in refractive index between the first dielectric portion 41 and the external environment, the propagation direction of light L0 may further change at the second surface 41b. The propagation direction of light L1 emitted from the first dielectric portion 41 is different from the propagation direction of light L0. In this manner, the first embodiment provides a light emitting element which enables control over the light distribution characteristic. In the light emitting element according to the first embodiment, the propagation direction of light L1 emitted from the first dielectric portion 41 is inclined, for example, oppositely to the second region R2 with reference to the propagation direction of light L0.

Similarly, light L0 emitted from the light emitting layer 13 becomes incident on the third surface 42c of the second dielectric portion 42. By the difference in refractive index between the first semiconductor layer 11 and the second dielectric portion 42, the propagation direction of light L0 propagating in the first direction (the Z-axis direction) changes at the third surface 42c. By the difference in refractive index between the second dielectric portion 42 and the external environment, the propagation direction of light L0 may further change at the fourth surface 42d. The propagation direction of light L2 emitted from the second dielectric portion 42 is different from the propagation direction of light L0. In the light emitting element according to the first embodiment, the propagation direction of light L2 emitted from the second dielectric portion 42 is inclined, for example, oppositely to the first region R1 with reference to the propagation direction of light L0.

For example, the divergence angle of light emitted from the light emitting element 110 (light L1 and light L2) is different from the divergence angle of light L0 emitted from the light emitting layer 13. In this example, the divergence angle of light emitted from the light emitting element 110 is greater than the divergence angle of light L0. The present embodiment provides a light emitting element which enables control over the light distribution characteristic.

The angle between the first surface 41a and the first direction (the Z-axis direction) may be different from the angle between the third surface 42c and the first direction (the Z-axis direction). For example, the angle between light L1 and the Z-axis direction may be different from the angle between light L2 and the Z-axis direction. The angle between the first surface 41a and the first direction (the Z-axis direction) can be in a range of, for example, 20 degrees to 60 degrees. The light emitting element 110 according to the present embodiment is capable of easily obtaining any light distribution characteristic.

For example, in a reference example of a display device such as a display panel, it may be desired to control the light distribution characteristic of the light emitting element to attain a desired state for reduced thickness and size. In order to realize control over the light distribution characteristic, for example, an optical component reflecting or diffracting light from the semiconductor layer is provided on a semiconductor layer. However, in such a reference example, the increased number of components reduces productivity.

In the present embodiment, the dielectric member 40 which includes inclined surfaces such as the first surface 41a and the third surface 42c is embedded in the semiconductor layered body 15. Thus, without inviting an increase in the number of optical components, the light distribution characteristic of the light emitting element is easily controlled by changing the angle between the first surface 41a and the first direction (the Z-axis direction) and the angle between the third surface 42c and the first direction (the Z-axis direction).

In the example shown in FIG. 1, the plane including the first surface 41a crosses the plane including the third surface 42c. The propagation direction of light L1 having transmitted through the first surface 41a contains a component which is different from the propagation direction of light L2 having transmitted through the third surface 42c.

In this example, as shown in FIG. 1, a distance d1 in the second direction (for example, the X-axis direction) between the first surface 41a and the third surface 42c increases in the direction from the second surface 41b to the light emitting layer 13 (the −Z direction). In this case, as shown in FIG. 3, the divergence angle of light emitted from the light emitting element 110 (light L1 and light L2) becomes greater than the divergence angle of light L0. Provision of the first dielectric portion 41 and the second dielectric portion 42 widens the light distribution characteristic of the X-axis direction. As compared to the light distribution characteristic of a light emitting element without the dielectric member 40, the light emitting element 110 has a wider light distribution characteristic. The dielectric member 40 functions as, for example, a Fresnel lens.

In the above-described example, the direction from the first dielectric portion 41 to the second dielectric portion 42 is in the X-axis direction. For example, in a top view, the first semiconductor layer 11 includes the first region R1 in which the first dielectric portion 41 is disposed, and the second region R2 in which the second dielectric portion 42 is disposed. The direction from the first region R1 to the second region R2 is in the second direction (for example, the X-axis direction).

As shown in FIG. 2, the dielectric member 40 can include an annular portion in a top view. One of the plurality of dielectric portions in the dielectric member 40 may be stripe-like. One of the plurality of dielectric portions included in the dielectric member 40 may be island-like.

Figure 4:
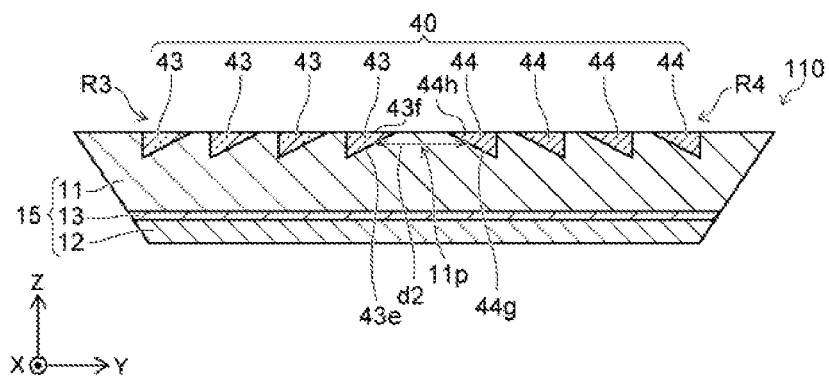
FIG. 4 is a schematic cross-sectional view exemplarily showing the light emitting element according to the first embodiment.

FIG. 4 is a schematic cross-sectional view exemplarily showing the light emitting element according to the first embodiment, and is a cross-sectional view taken along line IV-IV in FIG. 2.

As shown in FIGS. 2 and 4, the dielectric member 40 can include a third dielectric portion 43 and a fourth dielectric portion 44. The direction crossing a plane which includes the first direction and the second direction is defined as the third direction. The third direction is, for example, the Y-axis direction. In the third direction (the Y-axis direction), the portion 11p of the first semiconductor layer 11 is positioned between the third dielectric portion 43 and the fourth dielectric portion 44.

As shown in FIG. 4, the third dielectric portion 43 includes a fifth surface 43e and a sixth surface 43f. In the first direction (the Z-axis direction), the fifth surface 43e is positioned between the sixth surface 43f and the first semiconductor layer 11. The fifth surface 43e is inclined relative to the first direction (the Z-axis direction).

The fourth dielectric portion 44 includes a seventh surface 44g and an eighth surface 44h. In the first direction (the Z-axis direction), the seventh surface 44g is positioned between the eighth surface 44h and the first semiconductor layer 11. The seventh surface 44g is inclined relative to the first direction (the Z-axis direction).

The shape and size of the third dielectric portion 43 may be similar to those of the first dielectric portion 41. The shape and size of the fourth dielectric portion 44 may be similar to those of the second dielectric portion 42.

As shown in FIG. 4, the distance in the third direction (the Y-axis direction) between the fifth surface 43e and the seventh surface 44g is defined as the distance d2. In this example, the distance d2 increases in the −Z-axis direction (the direction from the second surface 41b to the light emitting layer 13). This configuration widens the light distribution characteristic in the Y-axis direction. Provision of the first dielectric portion 41, the second dielectric portion 42, the third dielectric portion 43, and the fourth dielectric portion 44 implements a light emitting element of which light distribution characteristic in the X-axis direction and the Y-axis direction is wide.

Figure 5:
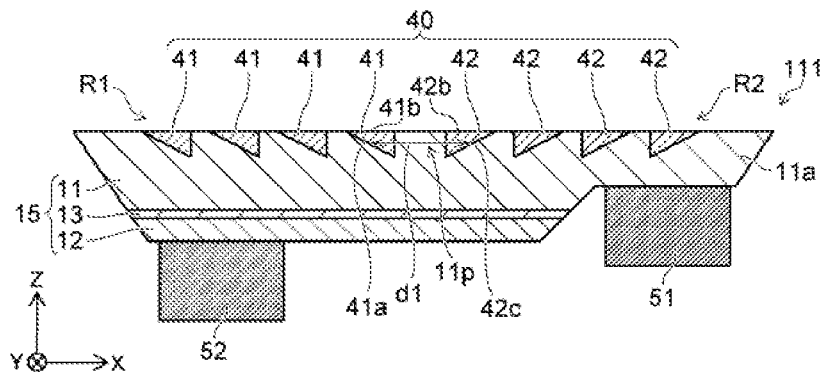
FIG. 5 is a schematic cross-sectional view exemplarily showing the light emitting element according to the first embodiment.

FIG. 5 is a schematic cross-sectional view exemplarily showing the light emitting element according to the first embodiment.

As shown in FIG. 5, a light emitting element 111 according to the present embodiment also includes the semiconductor layered body 15 and the dielectric member 40. The structure of the dielectric member 40 in the light emitting element 111 is different from that of the dielectric member 40 in the light emitting element 110. The rest of the structure of the light emitting element 111 is identical to that of the light emitting element 110.

In the light emitting element 111, the dielectric member 40 includes the first dielectric portion 41 and the second dielectric portion 42. The first dielectric portion 41 includes the first surface 41a and the second surface 41b. The second dielectric portion 42 includes the third surface 42c and the fourth surface 42d. The first surface 41a and the third surface 42c are inclined relative to the first direction (the Z-axis direction). In the light emitting element 111, the distance d1 in the second direction between the first surface 41a and the third surface 42c (for example, the X-axis direction) reduces in the direction from the second surface 41b to the light emitting layer 13 (the −Z direction). In this case, the divergence angle in the X-axis direction of light emitted from the light emitting element 111 becomes smaller than the divergence angle of light of a light emitting element without the dielectric member 40, and presents a narrow light distribution characteristic.

The light distribution characteristic of the light emitting element 111 is different from the light distribution characteristic of the light emitting element 110. Changing the structure of a plurality of portions included in the dielectric member 40 easily provides a desired light distribution characteristic.

The disposition pattern of the dielectric member 40 in the light emitting element 111 can be similar to the disposition pattern of the dielectric member 40 in the light emitting element 110. For example, in a top view, the first semiconductor layer 11 includes the first region R1 in which the first dielectric portion 41 is disposed and the second region R2 in which the second dielectric portion 42 is disposed. The direction from the first region R1 to the second region R2 is in the second direction (the X-axis direction).

In the light emitting element 111, the dielectric member 40 can include the third dielectric portion 43 and the fourth dielectric portion 44 (see FIGS. 2 and 4). Provision of the third dielectric portion 43 and the fourth dielectric portion 44 narrows the light distribution characteristic also in the Y-axis direction.

Figure 6:
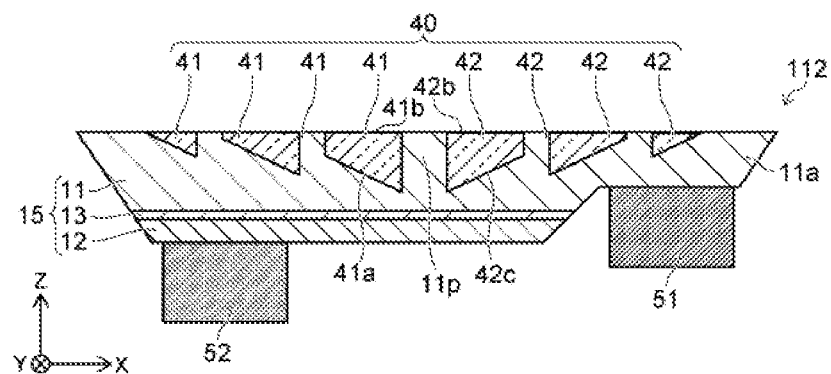
FIG. 6 is a schematic cross-sectional view exemplarily showing the light emitting element according to the first embodiment.

FIG. 6 is a schematic cross-sectional view exemplarily showing the light emitting element according to the first embodiment.

As shown in FIG. 6, the light emitting element 112 according to the present embodiment also includes the semiconductor layered body 15 and the dielectric member 40. The dielectric member 40 includes the first dielectric portion 41 and the second dielectric portion 42. In the light emitting element 112, the plurality of dielectric portions included in the dielectric member 40 are different from one another in thickness. As used herein, the thickness of the dielectric portions refers to the greatest length in the Z-axis direction of the dielectric portions. The dielectric member 40 exhibits, for example, the lens effect. The thickness of the plurality of dielectric portions gradually changes, for example, from the central portion toward the outside in the X-Y plane of the first semiconductor layer 11. In this example, the thickness of the plurality of dielectric portions gradually reduces from the central portion toward the outside in the X-Y plane of the first semiconductor layer 11. In the embodiment, the thickness of the plurality of dielectric portions may gradually increase from the central portion toward the outside in the X-Y plane of the first semiconductor layer 11.

Second Embodiment

A second embodiment relates to a method of manufacturing a light emitting element.

Figure 7:
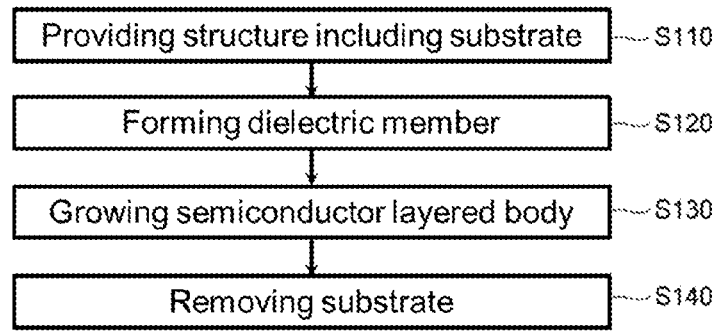
FIG. 7 is a flowchart exemplarily showing a method of manufacturing a light emitting element according to a second embodiment.

FIG. 7 is a flowchart exemplarily showing the method of manufacturing a light emitting element according to the second embodiment. FIGS. 8 to 15 are each a schematic cross-sectional view exemplarily showing the method of manufacturing a light emitting element according to the second embodiment.

As shown in FIG. 7, the method of manufacturing a light emitting element according to the present embodiment includes, for example, providing a structure (Step S110), forming the dielectric member 40 (Step S120), growing the semiconductor layered body 15 (Step S130), and removing a substrate 10s (Step S140). In the following, a description will be given of an example of these steps.

Figure 8:
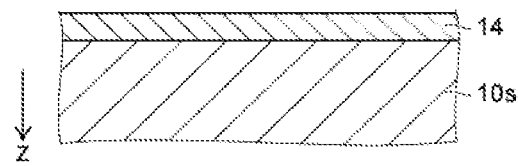
FIG. 8 is a schematic cross-sectional view exemplarily showing the method of manufacturing a light emitting element according to the second embodiment.

As shown in FIG. 8, the semiconductor member 14 is formed on the substrate 10s. The substrate 10s is, for example, a silicon substrate. The semiconductor member 14 is, for example, a nitride semiconductor. The semiconductor member 14 is, for example, a GaN layer. Crystal of the semiconductor member 14 grows on the substrate 10s.

Figure 9:
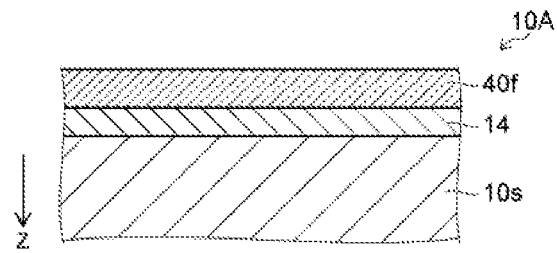
FIG. 9 is a schematic cross-sectional view exemplarily showing the method of manufacturing a light emitting element according to the second embodiment.

As shown in FIG. 9, a dielectric layer 40f is formed on the semiconductor member 14. The dielectric layer 40f is, for example, an SiO₂ layer. In this manner, a structure 10A which includes the substrate 10s, the dielectric layer 40f, and the semiconductor member 14 is provided (Step S110). The semiconductor member 14 is provided between the substrate 10s and the dielectric layer 40f.

Figure 10:
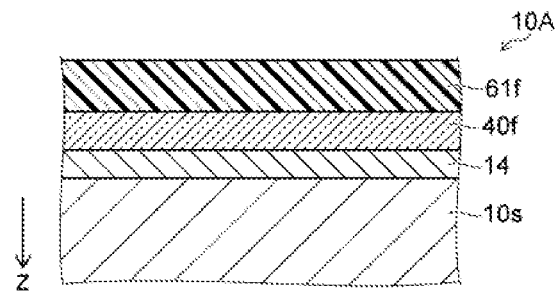
FIG. 10 is a schematic cross-sectional view exemplarily showing the method of manufacturing a light emitting element according to the second embodiment.

As shown in FIG. 10, a mask film 61f (a mask layer 61 which will be described below) is formed on the dielectric layer 40f.

Figure 11:
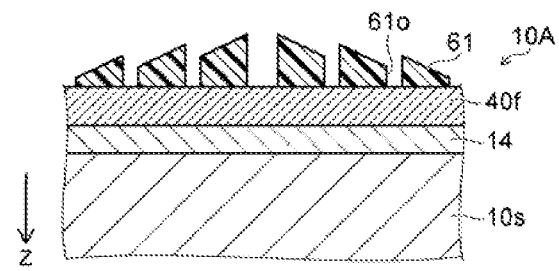
FIG. 11 is a schematic cross-sectional view exemplarily showing the method of manufacturing a light emitting element according to the second embodiment.

As shown in FIG. 11, the mask film 61f on the dielectric layer 40f is processed to be a mask layer 61. The mask layer 61 includes an opening part 61o. In this example, the mask layer 61 includes, for example, a plurality of portions varying in thickness from one another from the central portion toward the outside of the semiconductor member 14. The plurality of portions of the mask layer 61 is disposed so as to correspond to the region where the dielectric member 40 is provided. The upper surface of the mask layer 61 is inclined relative to the upper surface of the dielectric layer 40f. The shape of the mask layer 61 reflects on the dielectric layer 40f. Adjusting the inclination angle of the upper surface of the mask layer 61 provides a desired inclination angle of the upper surface of the dielectric member 40. Such a mask layer 61 is obtained by, for example, photolithography and etching. Imprinting may be performed in at least part of the forming the mask layer 61.

Figure 12:
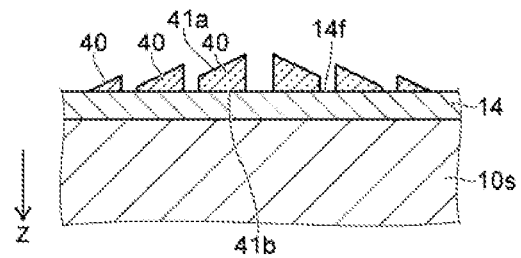
FIG. 12 is a schematic cross-sectional view exemplarily showing the method of manufacturing a light emitting element according to the second embodiment.

As shown in FIG. 12, using the mask layer 61 as a mask, a portion of the dielectric layer 40f is removed. For example, a portion of the dielectric layer 40f may be removed by dry etching. By removing a portion of the dielectric layer 40f, a portion (a surface 14f) of the semiconductor member 14 is exposed. The remaining portion of the dielectric layer 40f becomes the dielectric member 40. The upper surface of the dielectric member 40 is inclined by the inclination of the upper surface of the mask layer 61. In this manner, by removing a portion of the dielectric layer 40f, the surface 14f of the semiconductor member 14 is exposed, to form the dielectric member 40 from the dielectric layer 40f (Step S120).

In the step of forming the dielectric member 40 (Step S120), the dielectric member 40 includes the first surface 41a and the second surface 41b (see FIG. 12). The first surface 41a is in contact with the semiconductor layered body 15, and inclined relative to the first direction (the Z-axis direction) from the semiconductor member 14 to the semiconductor layered body 15. The second surface 41b is positioned between the first surface 41a and the semiconductor member 14.

Figure 13:
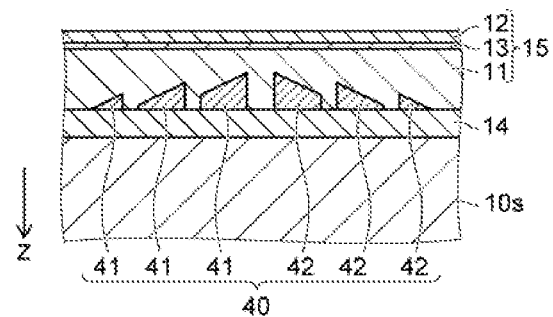
FIG. 13 is a schematic cross-sectional view exemplarily showing the method of manufacturing a light emitting element according to the second embodiment.

As shown in FIG. 13, as described above, after the removing a portion of the dielectric layer 40f to expose the surface 14f of the semiconductor member 14, the semiconductor layered body 15 is grown on the exposed surface 14f (Step S130). The semiconductor layered body 15 covers the surface of the dielectric member 40. The semiconductor layered body 15 includes, for example, the first semiconductor layer 11, the second semiconductor layer 12, and the light emitting layer 13. The step of growing the semiconductor layered body 15 includes epitaxially growing the semiconductor layered body 15 from the exposed surface 14f. The first semiconductor layer 11 is preferably grown by a thickness enough to cover the dielectric member 40. This grows the light emitting layer 13 with excellent crystallinity on the first semiconductor layer 11.

Figure 14:
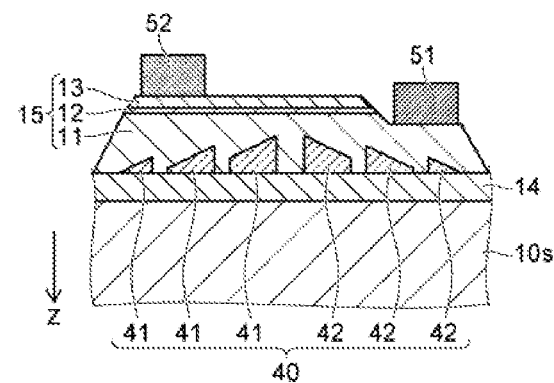
FIG. 14 is a schematic cross-sectional view exemplarily showing the method of manufacturing a light emitting element according to the second embodiment.

As shown in FIG. 14, the semiconductor layered body 15 is patterned, to expose a portion of the first semiconductor layer 11 from the second semiconductor layer 12 and the light emitting layer 13. The patterning the semiconductor layered body 15 causes the lateral surfaces of the first semiconductor layer 11, the second semiconductor layer 12, and the light emitting layer 13 to be inclined relative to the first direction (the Z-axis direction). On the semiconductor layered body 15, the first electrode 51 and the second electrode 52 are formed. The first electrode 51 is electrically connected to the first semiconductor layer 11. The second electrode 52 is electrically connected to the second semiconductor layer 12.

Figure 15:
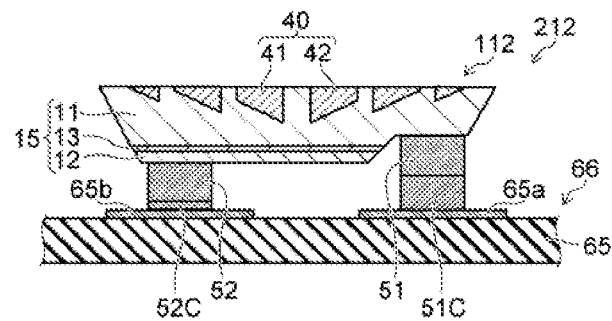
FIG. 15 is a schematic cross-sectional view exemplarily showing the method of manufacturing a light emitting element according to the second embodiment.

As shown in FIG. 15, the substrate 10s is removed (Step S140). Thus, for example, the light emitting element 112 is obtained. As necessary, after the removing the substrate 10s, the semiconductor member 14 may be removed, to expose the second surface 41b from the semiconductor layered body 15. The semiconductor member 14 may be left.

In the case where the light emitting element 112 is fixed to the mounting member 66, the removing the substrate 10s may be performed after the fixing the light emitting element 112 to the mounting member 66. The light emitting element 112 is fixed to the mounting member 66, and the light emitting device 212 is obtained.

As shown in FIG. 15, the light emitting device 212 includes the light emitting element 112 and the mounting member 66. The light emitting element 112 is provided with the dielectric member 40 which includes the first dielectric portion 41 and the second dielectric portion 42. The mounting member 66 includes a mounting substrate 65, a first substrate electrode 65a, and a second substrate electrode 65b. The first substrate electrode 65a and the first electrode 51 are electrically connected to each other by a connecting member 51C. The second substrate electrode 65b and the second electrode 52 are electrically connected to each other by a connecting member 52C. The connecting members 51C and 52C include, for example, solder or the like.

By the first electrode 51 and the second electrode 52 being connected by the connecting members 51C and 52C, the light emitting element 112 is fixed to the mounting member 66. After the mounting, the substrate 10s may be removed.

In the embodiment, the step of forming the dielectric member 40 (Step S120) includes, for example, forming the mask film 61f (the mask layer 61) on the dielectric layer 40f (see FIG. 10). The step of forming the dielectric member 40 (Step S120) further includes, for example, inclining the surface of at least a portion of the mask layer 61 relative to the first direction (the Z-axis direction) (see FIG. 11). The step of forming the dielectric member 40 (Step S120) includes, for example, removing a portion of the dielectric layer 40f using the inclined mask layer 61 as a mask (see FIG. 12). The surface of the formed dielectric member 40 is inclined because of the surface of the inclined mask layer 61 being inclined.

In the embodiment, the method of manufacturing the light emitting element may further include the step of forming an electrode (for example, at least one of the first electrode 51 and the second electrode 52) on the semiconductor layered body 15 (see FIG. 14). It is also possible to form the dielectric member 40 on the substrate 10s, and grow the semiconductor layered body 15 so as to cover the surface of the substrate 10s and the surface of the dielectric member 40.

The embodiments provide the light emitting element which enables control over the light distribution characteristic and the method of manufacturing the same.

Note that, in the present specification, the terms "perpendicular" and "parallel" do not mean just strict perpendicular and strict parallel, and cover, for example, variations in manufacturing steps. They may mean substantially perpendicular and substantially parallel.

In the foregoing, with reference to the specific examples, a description has been given of the embodiments of the present disclosure. However, the present disclosure is not limited to these specific examples. For example, the specific configuration of the semiconductor layer, the resin member, the resin layer, the reflective layer, the electrode and the like included in the light emitting element is covered by the scope of the present disclosure so long as a man skilled in the art can similarly practice the present disclosure and obtain the similar effect by selecting from the known technical scope as appropriate.

Furthermore, a combination of at least two elements of the specific examples in a technically possible range is also covered by the scope of the present disclosure so long as it involves the gist of the present disclosure.

What is claimed is:

1. A light emitting element comprising:
a semiconductor layered body comprising:
a first semiconductor layer of a first conductivity type,
a second semiconductor layer of a second conductivity type, and
a light emitting layer provided between the first semiconductor layer and the second semiconductor layer; and
a dielectric member disposed in contact with the first semiconductor layer; wherein
the first semiconductor layer refractive index with respect to a wavelength of light differs from the light emitting layer refractive index with respect to the wavelength of light,
the dielectric member comprises a first dielectric portion and a second dielectric portion,
in a second direction that is perpendicular to a first direction that extends from the second semiconductor layer to the first semiconductor layer, a first portion of the first semiconductor layer is positioned between the first dielectric portion and the second dielectric portion,
the first dielectric portion comprises a first surface and a second surface,
in the first direction, the first surface is positioned between the second surface and the first semiconductor layer,
the first surface is inclined relative to the first direction,
the second dielectric portion comprises a third surface and a fourth surface,
in the first direction, the third surface is positioned between the fourth surface and the first semiconductor layer,
the third surface is inclined relative to the first direction, and
a distance in the second direction between the first surface and the third surface increases in a direction from the second surface to the light emitting layer.

2. A light emitting element comprising:
a semiconductor layered body comprising:
a first semiconductor layer of a first conductivity type,
a second semiconductor layer of a second conductivity type, and
a light emitting layer provided between the first semiconductor layer and the second semiconductor layer; and
a dielectric member disposed in contact with the first semiconductor layer; wherein
the first semiconductor layer refractive index with respect to a wavelength of light differs from the light emitting layer refractive index with respect to the wavelength of light,
the dielectric member comprises a first dielectric portion and a second dielectric portion,
in a second direction that is perpendicular to a first direction that extends from the second semiconductor layer to the first semiconductor layer, a first portion of the first semiconductor layer is positioned between the first dielectric portion and the second dielectric portion,
the first dielectric portion comprises a first surface and a second surface,
in the first direction, the first surface is positioned between the second surface and the first semiconductor layer,
the first surface is inclined relative to the first direction,
the second dielectric portion comprises a third surface and a fourth surface,
in the first direction, the third surface is positioned between the fourth surface and the first semiconductor layer,
the third surface is inclined relative to the first direction, and
a distance in the second direction between the first surface and the third surface reduces in a direction from the second surface to the light emitting layer.

3. The light emitting element according to claim 1, wherein
in a top view, the first semiconductor layer comprises a first region in which the first dielectric portion is disposed, and a second region in which the second dielectric portion is disposed, and
a direction from the first region to the second region is in the second direction.

4. The light emitting element according to claim 1, wherein
the dielectric member comprises a third dielectric portion and a fourth dielectric portion,
in a third direction crossing a plane including the first direction and the second direction, the first portion of the first semiconductor layer is positioned between the third dielectric portion and the fourth dielectric portion,
the third dielectric portion comprises a fifth surface and a sixth surface,
in the first direction, the fifth surface is positioned between the sixth surface and the first semiconductor layer, the fifth surface is inclined relative to the first direction,
the fourth dielectric portion comprises a seventh surface and an eighth surface,
in the first direction, the seventh surface is positioned between the eighth surface and the first semiconductor layer,
the seventh surface is inclined relative to the first direction, and
a distance in the third direction between the fifth surface and the seventh surface increases or reduces in the direction from the second surface to the light emitting layer.

5. The light emitting element according to claim 2, wherein
the dielectric member comprises a third dielectric portion and a fourth dielectric portion,
in a third direction crossing a plane including the first direction and the second direction, the first portion of the first semiconductor layer is positioned between the third dielectric portion and the fourth dielectric portion,
the third dielectric portion comprises a fifth surface and a sixth surface,
in the first direction, the fifth surface is positioned between the sixth surface and the first semiconductor layer,
the fifth surface is inclined relative to the first direction,
the fourth dielectric portion comprises a seventh surface and an eighth surface,
in the first direction, the seventh surface is positioned between the eighth surface and the first semiconductor layer,
the seventh surface is inclined relative to the first direction, and
a distance in the third direction between the fifth surface and the seventh surface increases or reduces in the direction from the second surface to the light emitting layer.

6. The light emitting element according to claim 3, wherein
the dielectric member comprises a third dielectric portion and a fourth dielectric portion,
in a third direction crossing a plane including the first direction and the second direction, the first portion of the first semiconductor layer is positioned between the third dielectric portion and the fourth dielectric portion,
the third dielectric portion comprises a fifth surface and a sixth surface,
in the first direction, the fifth surface is positioned between the sixth surface and the first semiconductor layer,
the fifth surface is inclined relative to the first direction,
the fourth dielectric portion comprises a seventh surface and an eighth surface,
in the first direction, the seventh surface is positioned between the eighth surface and the first semiconductor layer,
the seventh surface is inclined relative to the first direction, and
a distance in the third direction between the fifth surface and the seventh surface increases or reduces in the direction from the second surface to the light emitting layer.

7. The light emitting element according to claim 1, wherein
the first surface and the third surface are in contact with the first semiconductor layer, and
the second surface and the fourth surface are exposed from the first semiconductor layer.

8. The light emitting element according to claim 2, wherein
the first surface and the third surface are in contact with the first semiconductor layer, and
the second surface and the fourth surface are exposed from the first semiconductor layer.

9. The light emitting element according to claim 3, wherein
the first surface and the third surface are in contact with the first semiconductor layer, and
the second surface and the fourth surface are exposed from the first semiconductor layer.

10. The light emitting element according to claim 2, wherein the first semiconductor layer comprises GaN, and the dielectric member comprises $SiO_2$.

11. The light emitting element according to claim 1, wherein the first semiconductor layer comprises GaN, and the dielectric member comprises $SiO_2$.

12. The light emitting element according to claim 2, wherein in a top view, the dielectric member includes an annular portion.

13. The light emitting element according to claim 1, wherein in a top view, the dielectric member includes an annular portion.

* * * * *